United States Patent
Kim et al.

(10) Patent No.: US 12,234,393 B2
(45) Date of Patent: Feb. 25, 2025

(54) ADHESIVE SHEET AND METHOD FOR MANUFACTURING DISPLAY DEVICE USING THE SAME

(71) Applicant: Samsung Display Co., Ltd., Yongin-si (KR)

(72) Inventors: Won-Seok Kim, Seoul (KR); Boo-Kan Ki, Yongin-si (KR); Sebeen Lee, Seoul (KR); Jeongin Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/830,809

(22) Filed: Jun. 2, 2022

(65) Prior Publication Data

US 2023/0010944 A1    Jan. 12, 2023

(30) Foreign Application Priority Data

Jul. 9, 2021    (KR) ........................ 10-2021-0090307

(51) Int. Cl.
*C09J 7/10*    (2018.01)
*B32B 27/08*    (2006.01)
(Continued)

(52) U.S. Cl.
CPC ................. *C09J 7/10* (2018.01); *B32B 27/08* (2013.01); *B32B 27/281* (2013.01); *B32B 27/36* (2013.01); *B32B 37/1284* (2013.01); *C09J 7/22* (2018.01); *C09J 7/403* (2018.01); *B32B 2457/206* (2013.01); *C09J 2301/122* (2020.08);
(Continued)

(58) Field of Classification Search
CPC ....... C09J 7/10; C09J 7/22; C09J 7/403; C09J 2301/122; C09J 2301/312; C09J 5/00; C09J 2203/318; C09J 7/203; C09J 7/405; B32B 27/08; B32B 27/281; B32B 27/36; B32B 37/1284; B32B 2457/206; H10K 59/12; H10K 59/1201; H10K 59/873; H10K 71/00; H10K 50/84

See application file for complete search history.

(56) References Cited

U.S. PATENT DOCUMENTS

| | | |
|---|---|---|
| 9,841,545 B2 | 12/2017 | Mizutani et al. |
| 10,748,973 B2 | 8/2020 | Han et al. |
| 2020/0347273 A1 | 11/2020 | Stockholm et al. |

FOREIGN PATENT DOCUMENTS

| | | | | |
|---|---|---|---|---|
| JP | 2014065899 A | * | 4/2014 | ............ B32B 3/263 |
| JP | 5963286 | | 8/2016 | |

(Continued)

OTHER PUBLICATIONS

Machine Translation of JP-2014065899-A. (Year: 2014).*

*Primary Examiner* — Patricia L. Nordmeyer
(74) *Attorney, Agent, or Firm* — KILE PARK REED & HOUTTEMAN PLLC

(57) ABSTRACT

An adhesive sheet including a first release film, a second release film disposed on the first release film, and an adhesive layer disposed between the first release film and the second release film, the adhesive layer including an upper surface facing the second release film, a lower surface facing the first release film, and a side surface extending from an edge of the lower surface to an edge of the upper surface. The side surface of the adhesive layer may be inclined with respect to a direction perpendicular to the upper surface and the lower surface.

15 Claims, 12 Drawing Sheets

(51) Int. Cl.
  *B32B 27/28*   (2006.01)
  *B32B 27/36*   (2006.01)
  *B32B 37/12*   (2006.01)
  *C09J 7/22*    (2018.01)
  *C09J 7/40*    (2018.01)
  *H10K 59/12*   (2023.01)

(52) U.S. Cl.
  CPC ......... *C09J 2301/312* (2020.08); *H10K 59/12* (2023.02); *H10K 59/1201* (2023.02)

(56) References Cited

FOREIGN PATENT DOCUMENTS

| KR | 10-2015-0140134 | 12/2015 |
| KR | 10-2018-0059645 | 6/2018 |
| KR | 10-2019-0062667 | 6/2019 |
| KR | 10-2066054 | 1/2020 |
| KR | 10-2020-0087806 | 7/2020 |

\* cited by examiner

FIG. 7

| Sample | | CNA | | | EDA | | | | SSA | | | |
|---|---|---|---|---|---|---|---|---|---|---|---|---|
| | | Mold | $CO_2$ | Femto | Pico | Mold | $CO_2$ | Femto | Pico | Mold | $CO_2$ | Femto | Pico |
| Indentation Creep[%] | Average | 85.5 | 85.0 | 83.4 | 84.7 | 86.6 | 86.7 | 63.0 | 69.4 | 79.1 | 90.5 | 54.4 | 44.6 |
| | Standard Deviation | 0.5 | 0.3 | 0.4 | 0.4 | 0.4 | 0.3 | 1.3 | 1.2 | 13.2 | 5.1 | 1.5 | 2.1 |
| Modulus [$K_{pa}$] | Average | 85.1 | 89.8 | 93.3 | 87.3 | 83.1 | 83.6 | 139.8 | 116.6 | 65.2 | 99.1 | 167.2 | 199.7 |
| | Standard Deviation | 0.1 | 0.2 | 0.7 | 0.5 | 0.8 | 0.5 | 4.0 | 1.8 | 9.0 | 4.5 | 5.3 | 9.4 |

| Laser | | | |
|---|---|---|---|
| Power | $CO_2$ | Pico | Femto |
| 20% | 0.0166 | 0.0097 | 0.0005 |
| 40% | 0.0201 | 0.0109 | 0.0143 |
| 80% | Unmeasurable | 0.0212 | 0.018 |

ADHESIVE SHEET AND METHOD FOR MANUFACTURING DISPLAY DEVICE USING THE SAME

CROSS-REFERENCE TO RELATED APPLICATION(S)

This U.S. non-provisional patent application claims priority to and benefits of Korean Patent Application No. 10-2021-0090307 under 35 U.S.C. § 119, filed on Jul. 9, 2021 in the Korean Intellectual Property Office, the entire contents of which are incorporated herein by reference.

BACKGROUND

1. Technical Field

The disclosure herein relates to an adhesive sheet and a method for manufacturing a display device using the same.

2. Description of the Related Art

In general, an electronic device which provides images to a user, such as a smart phone, a digital camera, a notebook computer, a navigation system, or a smart television, may include a display device for displaying the images. The display device may generate images, and may provide the generated images to a user through a display screen.

A window of a display device may be bonded to a display panel. The window and the display panel may be bonded to each other by an adhesive. The adhesive may be cut by the blade of a mold to a size required for a process. The cutting surface of the adhesive cut by the blade may be uneven. An amount of external gas penetration may increase due to poor quality of the cutting surface.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an adhesive sheet in which the quality of a cutting surface may be improved so that penetration of air bubbles may be prevented and a dead space may be reduced. The disclosure provides a method of manufacturing a display device using the same.

An embodiment of the disclosure provides an adhesive sheet that may include a first release film, a second release film disposed on the first release film, and an adhesive layer disposed between the first release film and the second release film, the adhesive layer including an upper surface facing the second release film, a lower surface facing the first release film, and a side surface extending from an edge of the lower surface to an edge of the upper surface. The side surface of the adhesive layer may be inclined with respect to a direction perpendicular to the upper surface and the lower surface.

In an embodiment, the side surface of the adhesive layer may form an acute angle with respect to the lower surface of the adhesive layer.

In an embodiment, the acute angle may be set to an angle greater than or equal to about 30 degrees and less than about 90 degrees.

In an embodiment, the side surface of the adhesive layer may form an obtuse angle with respect to the upper surface of the adhesive layer.

In an embodiment, in a direction horizontal to the upper surface and the lower surface, a length of the upper surface may be less than a length of the lower surface.

In an embodiment, the side surface may have a flat shape in an inclined direction.

In an embodiment, the adhesive layer may include a central portion, and an edge portion between the central portion and the side surface, wherein a width of the edge portion, which may be defined as a length between the central portion and the side surface, may be less than about 2 mm.

In an embodiment, a modulus of the edge portion may be greater than a modulus of the central portion, and the modulus of the side surface may be greater than the modulus of the edge portion.

In an embodiment, the indentation creep of the edge portion may be less than the indentation creep of the central portion, and the indentation creep of the side surface may be less than the indentation creep of the edge portion.

In an embodiment, a thickness of the first release film and a thickness of the second release film may be defined as lengths in the direction perpendicular to the upper surface and the lower surface, and the thickness of the first release film may be less than the thickness of the second release film.

In an embodiment, the side surface may include a first surface extending from the upper surface, and a second surface extending from the first surface to the lower surface, and the first surface and the second surface extend at different angles with respect to the upper surface and the lower surface.

In an embodiment, the first surface may form an obtuse angle with respect to the upper surface, and the second surface may extend perpendicular to the lower surface.

In an embodiment, the first surface may extend perpendicular to the upper surface, and the second surface may form an acute angle with respect to the lower surface.

In an embodiment, the first surface may form an obtuse angle with respect to the upper surface, and the second surface may form an obtuse angle with respect to the lower surface.

In an embodiment, the first surface may form an obtuse angle with respect to the upper surface, and the second surface may form an acute angle with respect to the lower surface.

In an embodiment of the disclosure, a method for manufacturing a display device may include preparing an adhesive sheet including a first release film, a second release film, and an adhesive layer disposed between the first release film and the second release film, cutting the adhesive sheet with a laser beam, removing the first release film, bonding a display panel to a lower surface of the adhesive sheet from which the first release film may be removed, removing the second release film, and bonding a window to an upper surface of the adhesive sheet from which the second release film may be removed. The adhesive layer may include a lower surface facing the first release film, an upper surface facing the second release film, and a side surface formed by being cut by the laser beam and extending from the lower surface toward the upper surface. The side surface may be disposed inclined with respect to a direction perpendicular to the upper surface and the lower surface.

In an embodiment, the side surface of the adhesive layer may form an acute angle with respect to the lower surface of the adhesive layer.

In an embodiment, a bezel pattern may be disposed below a non-display part of the window, the adhesive layer may be bonded to the window to overlap the bezel pattern, and in case that the bezel pattern may be bonded to the adhesive layer, the bezel pattern may be disposed on the side surface of the adhesive layer.

In an embodiment, the laser beam may have a pulse width of about 500 fs to about 2500 fs, the laser beam may have an energy of about 5 W to about 20 W, and the laser beam may be irradiated at a rate of about 250 mm/s to about 3000 mm/s.

In an embodiment, the adhesive layer may include a central portion, and an edge portion between the central portion and the side surface, and a modulus of the edge portion may be greater than the modulus of the central portion, and a modulus of the side surface may be greater than the modulus of the edge portion.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings:

FIG. 7 is a table schematically showing test results of the dummy adhesive layer;

DETAILED DESCRIPTION OF THE EMBODIMENTS

Figure 1:
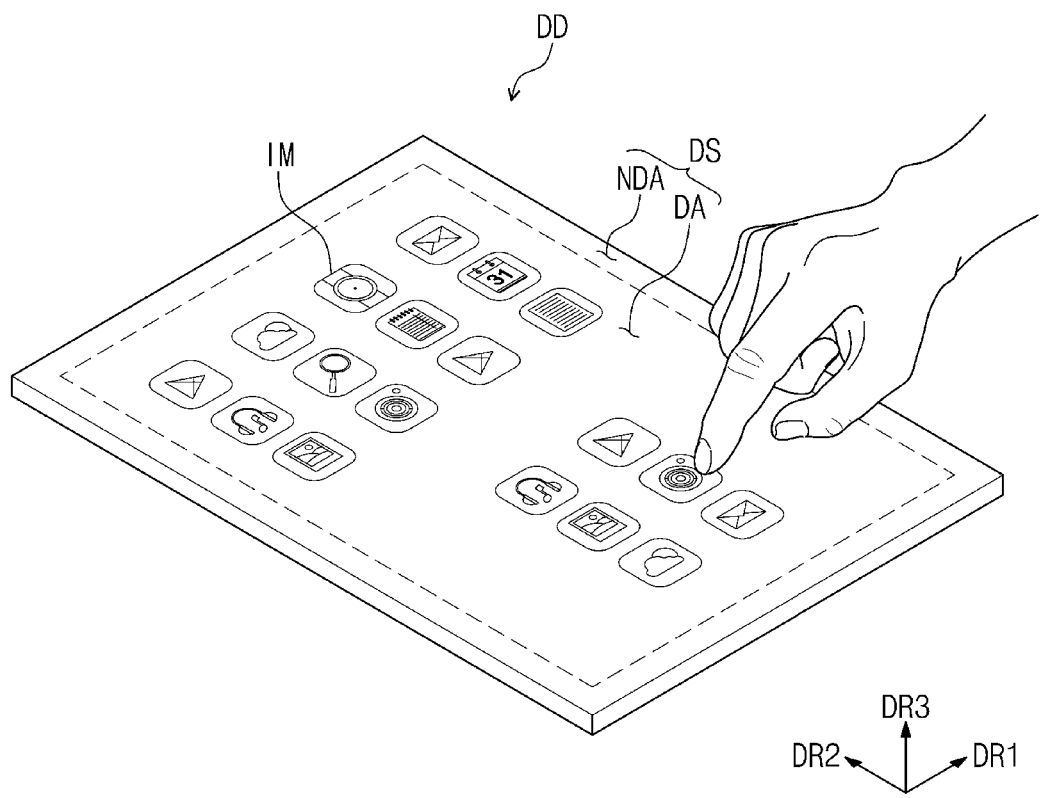
FIG. 1 is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

"Dead space" may mean a volume of space not necessarily intended, such as an air bubble.

Like reference numerals refer to like elements. Also, in the drawings, the thickness, the ratio, and the dimensions of elements may be exaggerated for an effective description of technical contents.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms "first", "second", etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the disclosure. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

It should be understood that the terms "comprise", "include", and "have" are intended to specify the presence of stated features, integers, steps, operations, elements, components, or combinations thereof in the disclosure, but do not preclude the presence or addition of one or more other features, integers, steps, operations, elements, components, or combinations thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About", "approximately", and "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

FIG. 1 is a schematic perspective view of a display device according to an embodiment of the disclosure.

Referring to FIG. 1, a display device DD according to an embodiment of the disclosure may have a rectangular shape which has short sides extending in a first direction DR1 and long sides extending in a second direction DR2 which crosses the first direction DR1. However, the disclosure is not limited thereto. The display device DD may have various shapes such as a circular shape or a polygonal shape.

Hereinafter, a direction substantially perpendicularly crossing a plane defined by the first direction DR1 and the second direction DR2 may be defined as a third direction DR3.

An upper surface of the display device DD may be defined as a display surface DS, and may have a plane defined by the first direction DR1 and the second direction DR2. Images IM generated by the display device DD may be provided to a user through the display surface DS.

The display surface DS may include a display part DA and a non-display part NDA around the display part DA. The display part DA may display an image, and the non-display part NDA may not display an image. The non-display part NDA may surround the display part DA, and may define an edge of the display device DD printed in a color.

The display device DD may be used for a television, a monitor, or large electronic devices such as an external advertisement board. Also, the display device DD may be used for a small-and-medium-sized electronic device such as a personal computer, a notebook computer, a personal digital terminal, a car navigation system, a game machine, a smart phone, a tablet, or a camera. However, these are merely a few sample embodiments, and the display device DD may be used for other electronic devices as long as it does not depart from the scope of the disclosure.

Figure 2:
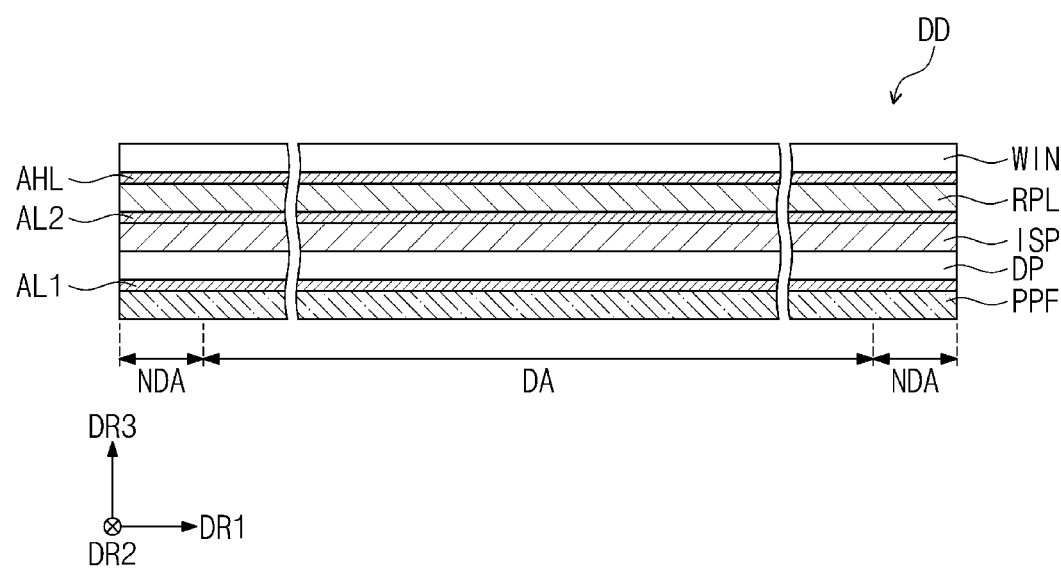
FIG. 2 is a schematic cross-sectional view illustrating a cross-section of the display device illustrated in FIG. 1.

FIG. 2 is a schematic cross-sectional view illustrating a cross-section of the display device illustrated in FIG. 1.

FIG. 2 illustrates a cross-section of the display device DD viewed in the second direction DR2.

Referring to FIG. 2, the display device DD may include a display panel DP, an input sensing unit ISP, a reflection prevention layer RPL, a window WIN, a panel protection film PPF, first and second adhesive layers AL1 and AL2, and an adhesive layer AHL.

The display panel DP may be a flexible display panel. The display panel DP according to an embodiment of the disclosure may be a light emission type display panel, but is not particularly limited thereto. For example, the display panel DP may be an organic light emission display panel and inorganic light emission display panel, or a quantum dot light emission display panel. An emission layer of the organic light emission display panel may include an organic light emission material, and an emission layer of the inorganic light emission display panel may include an inorganic light emission material. A light emission layer of a quantum dot light emission display panel may include a quantum dot, a quantum rod, and the like. Hereinafter, the display panel DP will be described as an organic light emission display panel.

The input sensing unit ISP may be disposed on the display panel DP. The input sensing unit ISP may include sensors (not shown) for sensing an external input in a capacitive manner.

The reflection prevention layer RPL may be disposed on the input sensing unit ISP. The reflection prevention layer RPL may reduce the reflectance of external light incident from above the display device DD toward the display panel DP. The reflection prevention layer RPL may include a phase retarder and/or a polarizer.

The window WIN may be disposed on the reflection prevention layer RPL. The window WIN may protect the display panel DP, the input sensing unit ISP, and the reflection prevention layer RPL from external scratches and impacts.

The panel protection film PPF may be disposed below the display panel DP. The panel protection film PPF may protect a lower portion of the display panel DP. The panel protective film PPF may include a flexible plastic material such as polyethyleneterephthalate (PET).

The first adhesive layer AL1 may be disposed between the display panel DP and the panel protection film PPF. The display panel DP and the panel protection film PPF may be bonded to each other by the first adhesive layer AL1.

The second adhesive layer AL2 may be disposed between the reflection prevention layer RPL and the input sensing unit ISP. The reflection prevention layer RPL and the input sensing unit ISP may be bonded to each other by the second adhesive layer AL2.

The adhesive layer AHL may be disposed between the window WIN and the reflection prevention layer RPL. The window WIN and the reflection prevention layer RPL may be bonded to each other by the adhesive layer AHL. The reflection prevention layer RPL and the display panel DP may be more readily bonded to the window WIN by the adhesive layer AHL. The adhesive layer AHL will be described in more detail with reference to FIG. 4 below.

Figure 3:
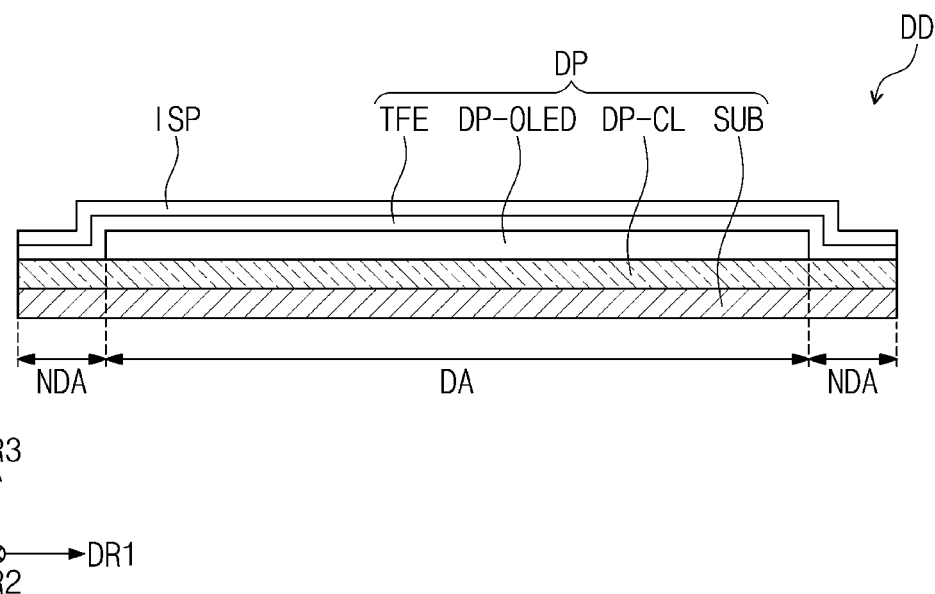
FIG. 3 is a schematic cross-sectional view of a display panel shown in FIG. 2.

FIG. 3 is a schematic cross-sectional view of a display panel shown in FIG. 2.

Referring to FIG. 3, the display panel DP includes a substrate SUB, a circuit element layer DP-CL disposed on the substrate SUB, a display element layer DP-OLED disposed on the circuit element layer DP-CL, and an encapsulation layer TFE disposed on the display element layer DP-OLED.

The substrate SUB may include a display part DA and a non-display part NDA around the display part DA. The substrate SUB may include a flexible plastic material. For example, the substrate SUB may include polyimide (PI).

The circuit element layer DP-CL may be disposed on the substrate SUB. The circuit element layer DP-CL may include an insulation layer, a semiconductor pattern, a conductive pattern, a signal line, and the like. The insulation layer, a semiconductor layer, and a conductive layer may be formed above the substrate SUB by coating, deposition, or the like, and thereafter, the insulation layer, the semiconductor layer, and the conductive layer may be selectively patterned through performing a photolithography process multiple times. Thereafter, the semiconductor pattern, the conductive pattern, and the signal line which may be included in the circuit element layer DP-CL may be formed.

The display element layer DP-OLED may be disposed on the display part DA. The display element layer DP-OLED may include a light emitting element. For example, the display element layer DP-OLED may include an organic light emission material, a quantum dot, a quantum rod, a micro-LED, or a nano-LED.

The encapsulation layer TFE may be disposed on the circuit element layer DP-CL to cover the display element layer DP-OLED. The encapsulation layer TFE may protect the display element layer DP-OLED from foreign materials such as moisture, oxygen, and dust particles.

The input sensing unit ISP may be disposed above the display panel DP. The input sensing unit ISP may sense an external input applied from the outside. The external input may be a user input. The user input may include various forms of external inputs such as a part of a user's body, light, heat, a pen, and pressure.

The input sensing unit ISP may be disposed on the display panel DP through a continuous process. The input sensing unit ISP may be described as being directly disposed on the display panel DP. The phase "being directly disposed" may mean that a third element may not be disposed between the input sensing unit ISP and the display panel DP. For example, a separate adhesive member may not be disposed between the input sensing unit ISP and the display panel DP.

In other embodiments, the input sensing unit ISP and the display panel DP may be coupled to each other through an adhesive member. The adhesive member may include a typical adhesive or pressure-sensitive adhesive.

Although not illustrated, the display device DD may further include an optical layer disposed on the input sensing unit ISP. The optical layer may improve front surface luminance of the display device DD by controlling the direction of light incident from the display panel DP.

Figure 4:
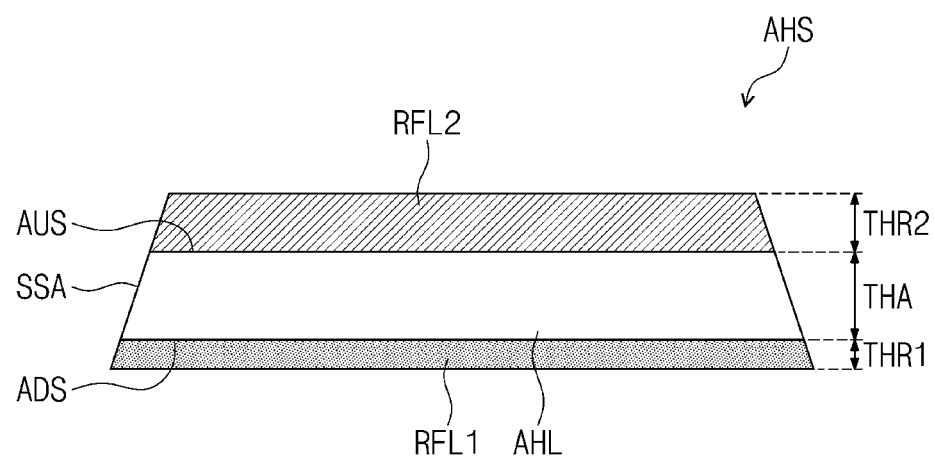
FIG. 4 is a schematic cross-sectional view of an adhesive sheet according to an embodiment of the disclosure.

FIG. 4 is a schematic cross-sectional view of an adhesive sheet according to an embodiment of the disclosure.

Referring to FIG. 4, an adhesive sheet AHS according to an embodiment of the disclosure may include a first release film RFL1, a second release film RFL2 disposed on the first release film RFL1, and the adhesive layer AHL disposed between the first release film RFL1 and the second release film RFL2.

The adhesive layer AHL may include a transparent adhesive layer such as an optically clear adhesive (OCA) layer, but the type of the adhesive layer AHL is not limited thereto. The adhesive layer AHL may include an upper surface AUS facing the second release film RFL2, a lower surface ADS facing the first release film RFL1, and a side surface SSA extending from an edge of the lower surface ADS to an edge of the upper surface AUS. The side surface SSA of the adhesive layer AHL may be disposed inclined with respect to a direction perpendicular to the upper surface AUS and the lower surface ADS. The side surface SSA of the adhesive layer AHL may have a flat shape in an inclined direction, but may have various shapes without being limited thereto.

The thickness THA of the adhesive layer AHL, a first thickness THR1 of the first release film RFL1, and a second thickness THR2 of the second release film RFL2 may be defined as the lengths in the direction perpendicular to the upper surface AUS and the lower surface ADS of the adhesive layer AHL. The first thickness THR1 of the first release film RFL1 may be less than the second thickness THR2 of the second release film RFL2. The second thickness THR2 of the second release film RFL2 may be less than the thickness THA of the adhesive layer AHL.

The first thickness THR1 of the first release film RFL1 may be about 45 to about 55 µm (hereinafter, micrometers). Specifically, the first thickness THR1 of the first release film RFL1 may be about 50 micrometers. The second thickness THR2 of the second release film RFL2 may be about 70 to about 80 micrometers. Specifically, the second thickness THR2 of the second release film RFL2 may be about 75 micrometers. The thickness THA of the adhesive layer AHL may be about 140 to about 160 micrometers. Specifically, the thickness THA of the adhesive layer AHL may be 150 micrometers. However, the first thickness THR1 of the first release film RFL1, the second thickness THR2 of the second release film RFL2, and the thickness THA of the adhesive layer AHL are not limited thereto.

Figure 5:
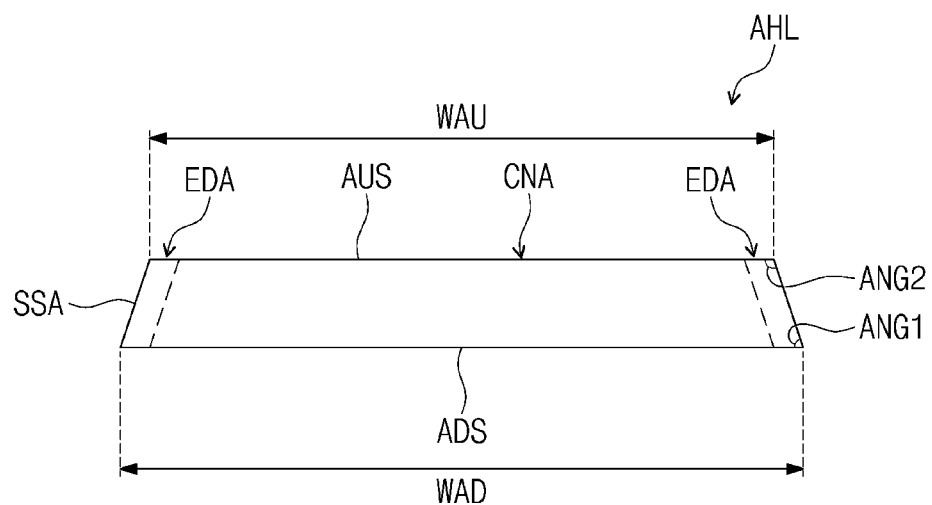
FIG. 5 is a schematic cross-sectional view of an adhesive layer according to an embodiment of the disclosure.

FIG. 5 is a schematic cross-sectional view of an adhesive layer according to an embodiment of the disclosure.

Referring to FIG. 5, the adhesive layer AHL may include a central portion CNA, and an edge portion EDA between the central portion CNA and the side surface SSA. The side surface SSA of the adhesive layer AHL may form a first angle ANG1 with respect to the lower surface ADS of the adhesive layer AHL, and the side surface SSA of the adhesive layer AHL may form a second angle ANG2 with respect to the upper surface AUS of the adhesive layer AHL.

The first angle ANG1 may be an acute angle, and the second angle ANG2 may be an obtuse angle. The first angle ANG1 may be greater than or equal to about 30 degrees, and may be less than about 90 degrees. For example, the adhesive layer AHL may have a trapezoidal shape. However, the sizes of the first and second angles ANG1 and ANG2, and the shape of the adhesive layer AHL are not limited thereto.

In a direction horizontal to the upper surface AUS and the lower surface ADS, the length WAU of the upper surface AUS and the length WAD of the lower surface ADS may be defined. The length WAU of the upper surface AUS may be less than the length WAD of the lower surface ADS.

Although not illustrated, the side surface SSA may be a surface cut by a laser beam. In case that the side surface SSA is cut, the side surface SSA may be melted by the laser beam, and solidified, thereby forming the edge portion EDA. The description of the side surface SSA cut by the laser beam will be described in detail with respect to FIG. 10A and FIG. 10B below.

The edge portion EDA formed in a portion adjacent to the side surface SSA of the adhesive layer AHL may have different properties from a central portion CNA. The width of the edge portion EDA may be defined as the length between the central portion CNA and the side surface SSA. The width of the edge portion EDA may be less than about 2 mm (millimeters).

Figure 6:
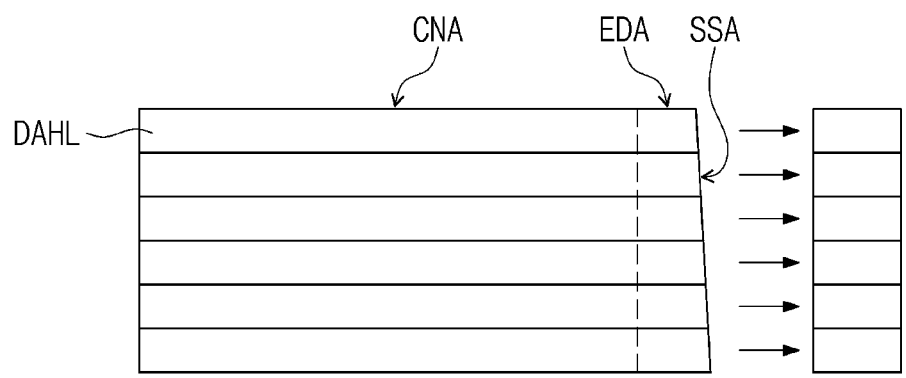
FIG. 6 is a schematic cross-sectional view of a dummy adhesive layer tested to describe an edge portion of an adhesive layer.

FIG. 6 is a schematic cross-sectional view of a dummy adhesive layer tested to describe an edge portion of an adhesive layer. FIG. 7 is a table schematically showing test results of the dummy adhesive layer.

Referring to FIG. 6, in order to compare the properties of the central portion CNA, the edge portion EDA, and the side surface SSA of the adhesive layer AHL, a test may be performed on dummy adhesive layers DAHL. The dummy adhesive layers DAHL formed of six stacked layers was tested. Although not illustrated, sides surfaces of the dummy adhesive layers DAHL were respectively cut by the blade of a mold, a CO2 laser beam, a Femto laser beam, and a Pico laser beam, and tested. A cutting surface which has been cut may be defined as a side surface SSA of the dummy adhesive layer DAHL. The dummy adhesive layer DAHL of FIG. 6 may be the dummy adhesive layers DAHL cut by any one among the blade of a mold, a CO2 laser beam, a Femto laser beam, and a Pico laser beam.

The edge portion EDA may be defined in a portion adjacent to the side surface SSA of the dummy adhesive layers DAHL. The central portion CNA may be defined in the dummy adhesive layer DAHL except for the portion in which the edge portion EDA may be defined.

Referring to FIG. 6 and FIG. 7, the modulus and the indentation creep of the dummy adhesive layers DAHL cut by the blade of a mold (hereinafter, a mold), a CO2 laser beam, a Femto laser beam, and a Pico laser beam were measured. The modulus and the indentation creep were measured in each of the central portion CNA, the edge portion EDA, and the side surface SSA of the dummy adhesive layers DAHL.

The measured modulus of the dummy adhesive layers DAHL cut by the mold was 85.1 Kilo Pascal (KPa, hereinafter, omitted) in the central portion CNA, 83.1 KPa in the edge portion EDA, and 65.2 KPa in the side surface SSA. The modulus of the dummy adhesive layers DAHL cut by the mold may be the largest in the central portion CNA, and the smallest in the side surface SSA.

The measured indentation creep of the dummy adhesive layers DAHL cut by the mold was 85.5% in the central portion CNA, 86.6% in the edge portion EDA, and 79.1% in the side surface SSA. The indentation creep of the dummy adhesive layers DAHL cut by the mold may be the largest in the edge portion EDA, and the smallest in the side surface SSA.

The measured modulus of the dummy adhesive layers DAHL cut by the CO2 laser beam was 89.8 KPa in the central portion CNA, 83.6 KPa in the edge portion EDA, and 99.1 KPa in the side surface SSA. The modulus of the dummy adhesive layers DAHL cut by the CO2 laser beam may be the largest in the side surface SSA, and the smallest in the central portion CNA.

The measured indentation creep of the dummy adhesive layers DAHL cut by the CO2 laser beam was 85.0% in the central portion CNA, 86.7% in the edge portion EDA, and 90.5% in the side surface SSA. The indentation creep of the dummy adhesive layers DAHL cut by the CO2 laser beam may be the largest in the side surface SSA, and the smallest in the central portion CNA.

The measured modulus of the dummy adhesive layers DAHL cut by the Femto laser beam was 93.3 KPa in the central portion CNA, 139.8 KPa in the edge portion EDA, and 167.2 KPa in the side surface SSA. In the dummy adhesive layers DAHL cut by the Femto laser beam, the modulus of the edge portion EDA may be greater than the modulus of the central portion CNA, and the modulus of the side surface SSA may be greater than the modulus of the edge portion EDA. The side surface SSA with an increased modulus may have less intrusion of air bubbles generated during a lamination process compared to the edge portion EDA. The side surface SSA may have less intrusion of air bubbles generated during the lamination process compared to the central portion CNA.

The measured indentation creep of the dummy adhesive layers DAHL cut by the Femto laser beam was 83.4% in the central portion CNA, 63.0% in the edge portion EDA, and 54.4% in the side surface SSA. In the dummy adhesive layers DAHL cut by the Femto laser beam, the indentation creep of the edge portion EDA may be less than the indentation creep of the central portion CNA, and the indentation creep of the side surface SSA may be less than the indentation creep of the edge portion EDA. In conclusion, the indentation creep may be reduced by greater than 20% in the side surface SSA than in the central portion CNA. Therefore, during the lamination process, there may be less deformation in the side surface SSA than in the central portion CNA, so that air bubbles penetrating into the side surface SSA of the dummy adhesive layers DAHL may be reduced.

The measured modulus of the dummy adhesive layers DAHL cut by the Pico laser beam was 87.3 KPa in the central portion CNA, 116.6 KPa in the edge portion EDA, and 199.7 KPa in the side surface SSA. In the dummy adhesive layers DAHL cut by the Pico laser beam, the modulus of the edge portion EDA may be greater than the modulus of the central portion CNA, and the modulus of the side surface SSA may be greater than the modulus of the edge portion EDA. The side surface SSA with an increased modulus may have less intrusion of air bubbles generated during a lamination process compared to the edge portion EDA. The side surface SSA may have less intrusion of air bubbles generated during the lamination process compared to the central portion CNA.

The measured indentation creep of the dummy adhesive layers DAHL cut by the Pico laser beam was 84.7% in the central portion CNA, 69.4% in the edge portion EDA, and 44.6% in the side surface SSA. In the dummy adhesive layers DAHL cut by the Pico laser beam, the indentation creep of the edge portion EDA may be less than the indentation creep of the central portion CNA, and the indentation creep of the side surface SSA may be less than the indentation creep of the edge portion EDA. In conclusion, the indentation creep may be reduced by greater than 30% in the side surface SSA than in the central portion CNA. Therefore, during the lamination process, there may be less deformation in the side surface SSA than in the central portion CNA, so that air bubbles penetrating into the side surface SSA of the dummy adhesive layers DAHL may be reduced.

Figure 8:
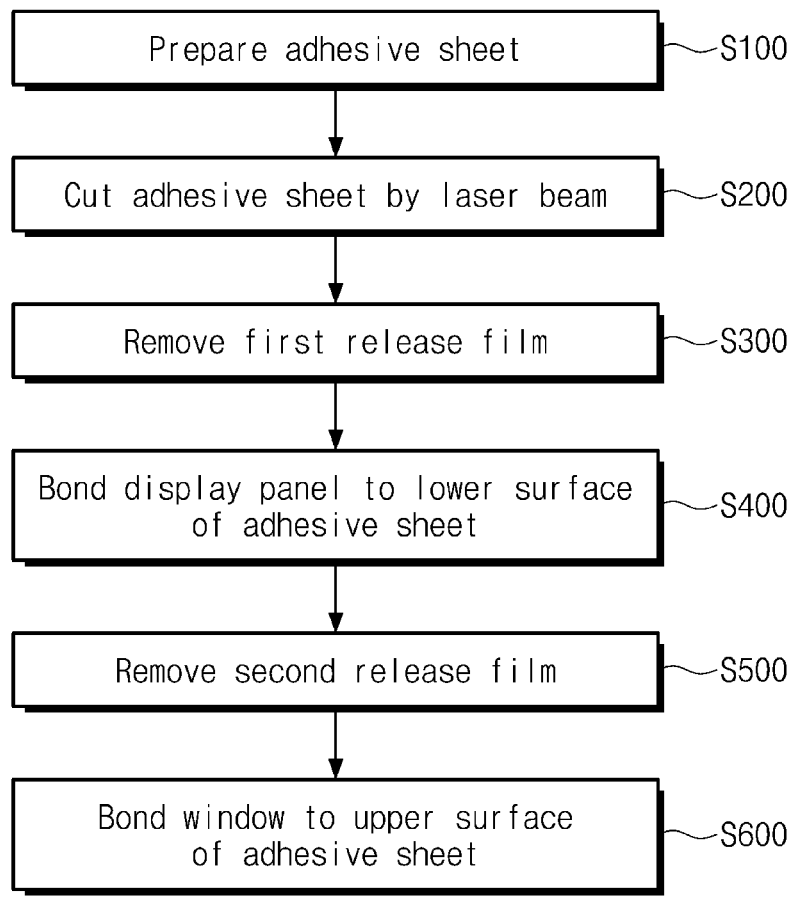
FIG. 8 is a schematic flowchart of a method for manufacturing a display device using an adhesive sheet according to an embodiment of the disclosure.
Figure 9:
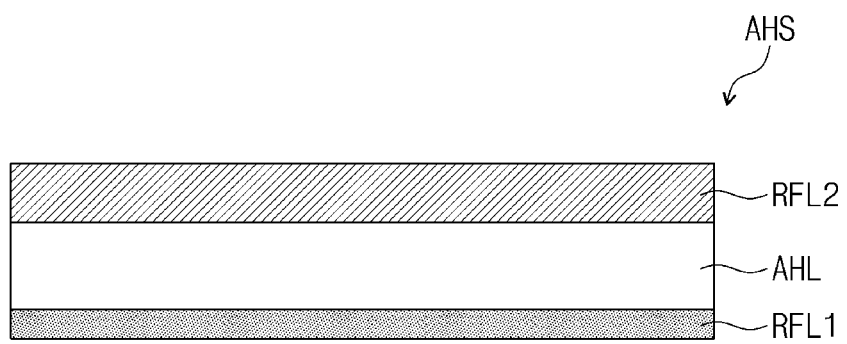
FIG. 9 is a schematic cross-sectional view of an adhesive sheet prepared to manufacture a display device.

FIG. 8 is a schematic flowchart of a method for manufacturing a display device using an adhesive sheet according to an embodiment of the disclosure. FIG. 9 is a schematic cross-sectional view of an adhesive sheet prepared to manufacture a display device.

FIG. 8 will be described as referenced together with the following drawings illustrating a method for manufacturing a display device.

Referring to FIG. 8 and FIG. 9, in Step S100, the adhesive sheet AHS according to an embodiment of the disclosure may be prepared. The adhesive sheet AHS may include the first release film RFL1, the second release film RFL2 disposed on the first release film RFL1, and the adhesive layer AHL disposed between the first release film RFL1 and the second release film RFL2.

The adhesive layer AHL disposed between the first release film RFL1 and the second release film RFL2 may be protected by the first release film RFL1 and the second release film RFL2. Therefore, while the adhesive sheet AHS may be transferred for another process, foreign substances may not be adsorbed to the adhesive layer AHL. The first release film RFL1 and the second release film RFL2 may include a plastic material such as polyethylene terephthalate (PET). However, the first release film RFL1 and the second release film RFL2 are not limited to the above material, and may include various materials such as release paper.

Figure 10A:
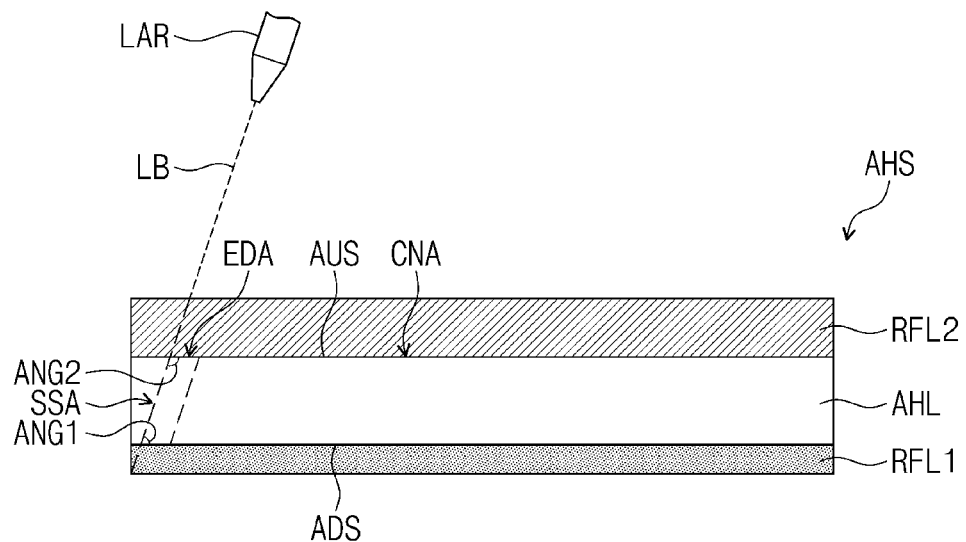
FIG. 10A is a schematic cross-sectional view of an adhesive sheet whose one side surface is cut by a laser beam.
Figure 10B:
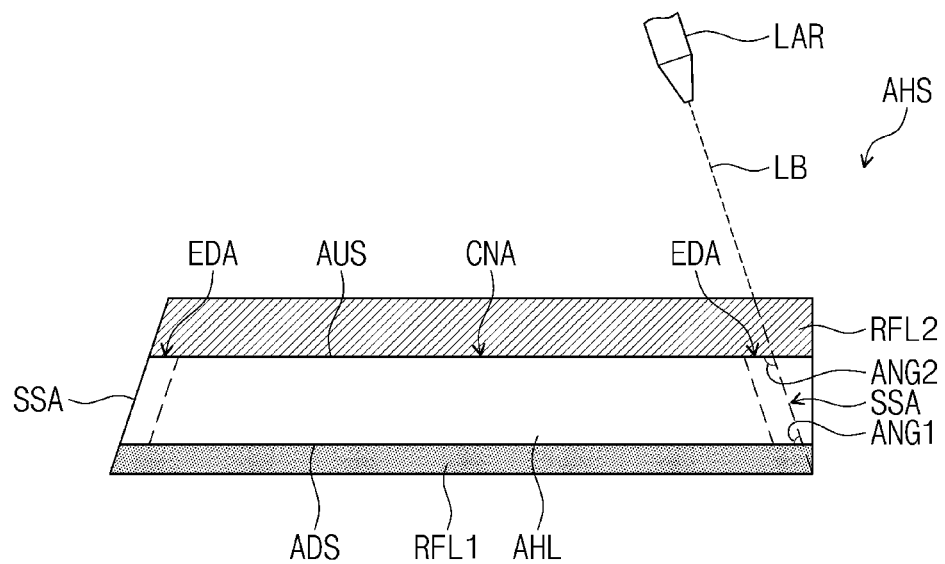
FIG. 10B is a schematic cross-sectional view of an adhesive sheet whose the other side surface is cut by a laser beam.

FIG. 10A is a schematic cross-sectional view of an adhesive sheet whose one side surface is cut by a laser beam. FIG. 10B is a schematic cross-sectional view of an adhesive sheet whose the other side surface is cut by a laser beam.

Referring to FIG. 8, FIG. 10A, and FIG. 10B, in Step S200, the adhesive sheet AHS may be cut by a laser beam LB.

A laser beam generator LAR may be disposed on the adhesive sheet AHS. The laser beam LB may be generated from the laser beam generator LAR. The laser beam LB may be a Femto laser beam or a Pico laser beam.

The laser beam generator LAR may be disposed on a side surface of the adhesive sheet AHS. The laser beam generator LAR may rotate and irradiate the laser beam LB in a direction forming the first angle ANG1 with the lower surface ADS of the adhesive layer AHL. Laser beam LB may have a pulse width of about 500 fs to about 2500 fs, may be set to a power of about 5 W to about 20 W, and may be irradiated at a rate of about 250 mm/s to about 3000 mm/s.

A side surface of the adhesive sheet AHS may be cut by the laser beam LB. The second release film RFL2, the adhesive layer AHL, and the first release film RFL1 of the adhesive sheet AHS may be sequentially cut to form an inclined surface with respect to a direction perpendicular to the upper surface AUS and the lower surface ADS of the adhesive layer AHL. On a side surface of the adhesive layer AHL, the side surface SSA may be formed. The edge portion EDA having different physical properties from the central portion CNA may be formed by the laser beam LB.

The side surface SSA may form the first angle ANG1 with the lower surface ADS of the adhesive layer AHL, and may form the second angle ANG2 with the upper surface AUS thereof.

The laser beam generator LAR may be moved in a direction parallel to the upper surface AUS of the adhesive layer AHL. The laser beam generator LAR may be disposed on another side surface of the adhesive sheet AHS. The laser beam generator LAR may rotate again and irradiate the laser beam LB on the other side surface of the adhesive sheet AHS.

The laser beam LB may be irradiated in a direction forming the first angle ANG1 with the lower surface ADS of the adhesive layer AHL. The other side surface of the adhesive sheet AHS may be cut to form an inclined surface with respect to a direction perpendicular to the upper surface AUS and the lower surface ADS of the adhesive layer AHL, and on the other side surface of the adhesive layer AHL, the side surface SSA may be formed.

The side surface SSA of the adhesive layer AHL may have various shapes by the laser beam LB. By controlling the irradiation angle and power of the laser beam LB irradiated on the adhesive sheet AHS, the side surface SSA of the adhesive layer AHL may be cut into a shape that may be readily processed. The various shapes of the side surface SSA will be described in detail with respect to FIG. 18 to FIG. 21.

The length of an upper surface of the adhesive sheet AHS may be less than the length of a lower surface thereof. The adhesive sheet AHS may have a trapezoidal shape, but is not limited thereto.

Figures 11, 12:
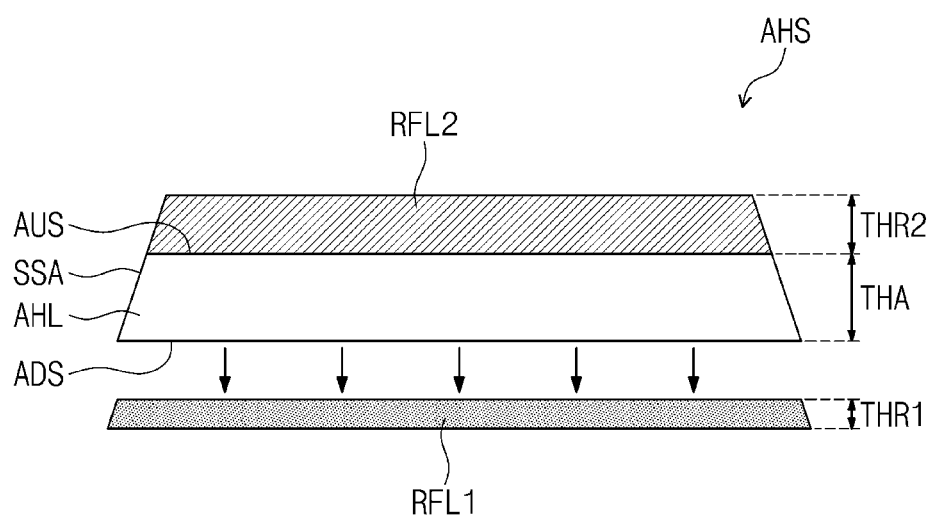
FIG. 11 is a table schematically showing errors occurring on a cutting surface according to the type and power of a laser beam.
FIG. 12 is a schematic cross-sectional view of an adhesive sheet from which a first release film is removed.

FIG. 11 is a table schematically showing errors occurring on a cutting surface according to the type and power of a laser beam.

Referring to FIG. 10A and FIG. 11, the laser beam LB of FIG. 10A was irradiated to form the first angle ANG1 with the lower surface ADS of the adhesive layer AHL, but even in case that the laser beam LB is irradiated in a direction perpendicular to the upper surface AUS and the lower surface ADS of the adhesive layer AHL, one side surface of the adhesive sheet AHS may form an inclined surface in which an upper surface may be shorter than a lower surface.

Since the laser beam LB may be irradiated on the upper surface of the adhesive sheet AHS, the laser beam LB may be irradiated longer on the upper surface of the adhesive sheet AHS than on the lower surface of the adhesive sheet AHS. Therefore, the upper surface of the adhesive sheet AHS may be more melted than the lower surface thereof, so that the length of the upper surface may become less than the length of the lower surface. Measurement values illustrated in the table are values obtained by measuring the degree to which the length of the upper surface becomes less than the length of the lower surface on one side surface of the adhesive sheet AHS.

The type of the laser beam LB may be a CO2 laser beam, a Pico laser beam, and a Femto laser beam. The laser beam LB was irradiated to a power of about 80%, about 40%, and about 20%. The power of the laser beam LB may be about 25 W in case about 100%.

Referring to the table, the length of the upper surface reduced by the CO2 laser beam may be unmeasurable at a power of about 80%, about 0.0201 μm at a power of about 40%, and about 0.0166 μm at a power of about 20%. The length of the upper surface reduced by the Pico laser beam may be about 0.0212 μm at a power of about 80%, about 0.0109 μm at a power of about 40%, and about 0.0097 μm at a power of about 20%. The length of the upper surface reduced by the Femto laser beam may be about 0.018 μm at a power of about 80%, about 0.0143 μm at a power of about 40%, and about 0.0005 μm at a power of about 20%.

Except in case that the power of the laser beam LB is about 40%, the Femto laser beam may have the smallest length compared to the CO2 laser beam and the Pico laser beam. In case that the laser beam LB of the same type was irradiated, the smaller the power of the laser beam LB, the smaller the length measured between one end of the lower surface of the adhesive sheet AHS and one end of the upper surface of the adhesive sheet AHS. For example, in case irradiated with the Femto laser beam of about 20% power, an error may be the smallest, and a precise cutting surface may be formed. Therefore, the quality of a cutting surface may be improved using a FEMTO laser of a power less than or equal to 20%.

FIG. 12 is a schematic cross-sectional view of an adhesive sheet from which a first release film is removed.

Referring to FIG. 8 and FIG. 12, in Step S300, the first release film RFL1 on a lower surface of the adhesive sheet AHS may be removed. The first thickness THR1 of the first release film RFL1 may be less than the second thickness THR2 of the second release film RFL2. The first release film RFL1 having the first thickness THR1 which may be less than that of the second release film RFL2 may be more readily separated from the adhesive layer AHL than the second release film RFL2.

Therefore, the first release film RFL1 having the first thickness THR1 which may be less than the second thickness THR2 of the second release film RFL2 may be disposed in a portion between the upper surface AUS and the lower surface ADS of the adhesive layer AHL where a process may be performed first, and thus, separated first from the adhesive layer AHL.

Figure 13:
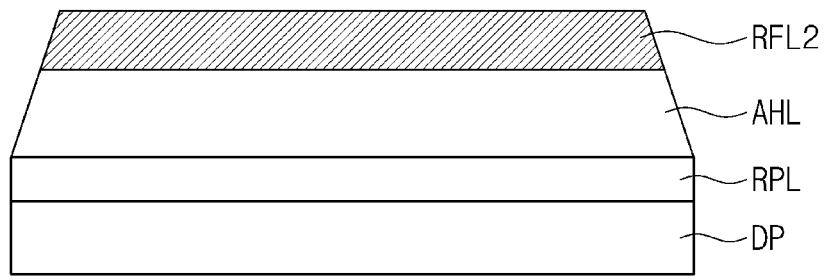
FIG. 13 is a schematic cross-sectional view of an adhesive sheet to which a display panel is bonded.

FIG. 13 is a schematic cross-sectional view of an adhesive sheet to which a display panel is bonded.

Referring to FIG. 8 and FIG. 13, in Step S400, the display panel DP may be bonded to the lower surface of the adhesive sheet AHS.

The refection prevention layer RPL and the display panel DP may be bonded to the adhesive layer AHL from which the first release film RFL1 may be removed. Although not illustrated, between the refection prevention layer RPL and the display panel DP, the input sensing unit ISP and the second adhesive layer AL2 illustrated in FIG. 2 may be disposed.

Figure 14:
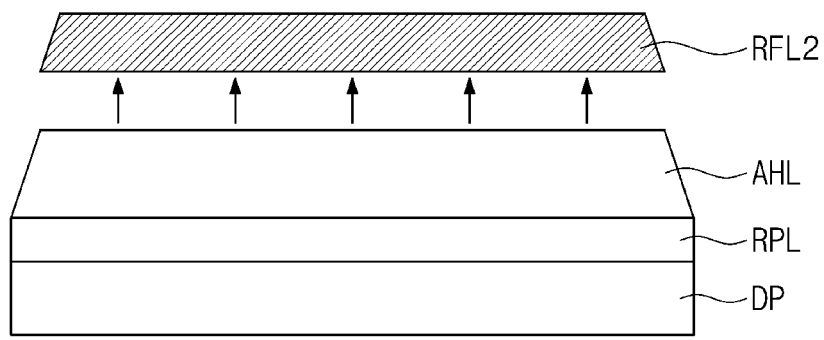
FIG. 14 is a schematic cross-sectional view of an adhesive sheet from which a second release film is removed.

FIG. 14 is a schematic cross-sectional view of an adhesive sheet from which a second release film is removed.

Referring to FIG. 8 and FIG. 14, in Step S500, the second release film RFL2 may be removed from the adhesive layer AHL.

Figure 15:
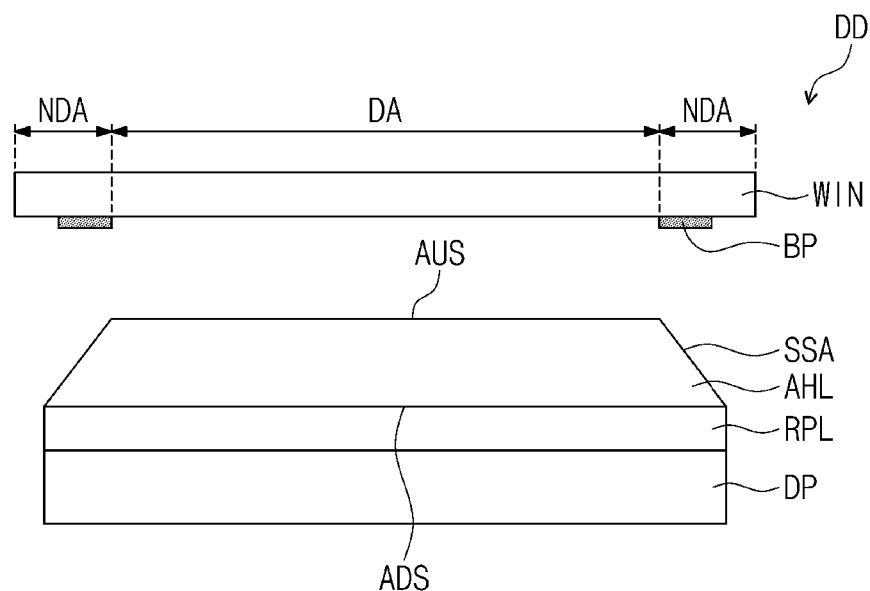
FIG. 15 is a schematic cross-sectional view of an adhesive sheet to which a window is bonded.

FIG. 15 is a schematic cross-sectional view of an adhesive sheet to which a window is bonded.

Referring to FIG. 8 and FIG. 15, in Step S600, the window WIN may be bonded to the upper surface of the adhesive sheet AHS.

The window WIN may be disposed on the adhesive layer AHL. The window WIN may include a bezel pattern BP disposed below the non-display part NDA of the window WIN.

The bezel pattern BP may be a colored light blocking film, and may be formed, for example, by a coating method. The bezel pattern BP may include a base material and a dye or a pigment mixed in the base material. The bezel pattern BP may have a closed line shape on a plane.

In a plan view, the bezel pattern BP may overlap the side surface SSA and the adhesive layer AHL. In case that the bezel pattern BP is bonded to the adhesive layer AHL, the bezel pattern BP may be disposed on the side surface SSA of the adhesive layer AHL.

Figure 16:
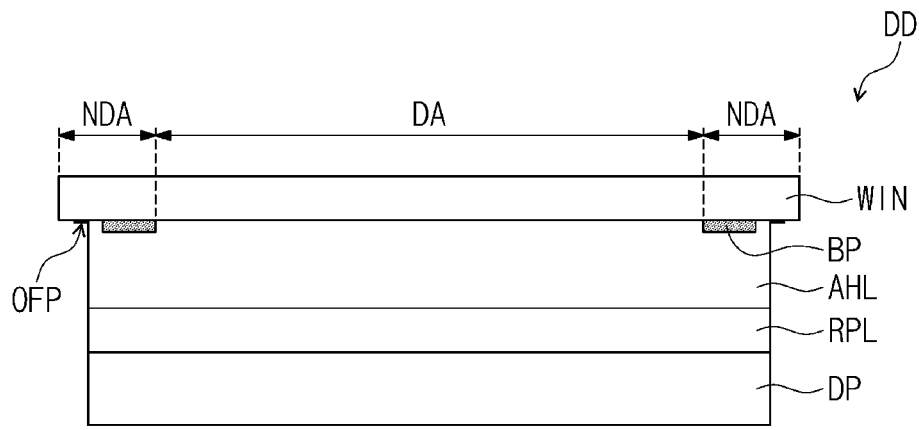
FIG. 16 is a schematic cross-sectional view of an adhesive sheet to which a window is bonded.
Figure 17:
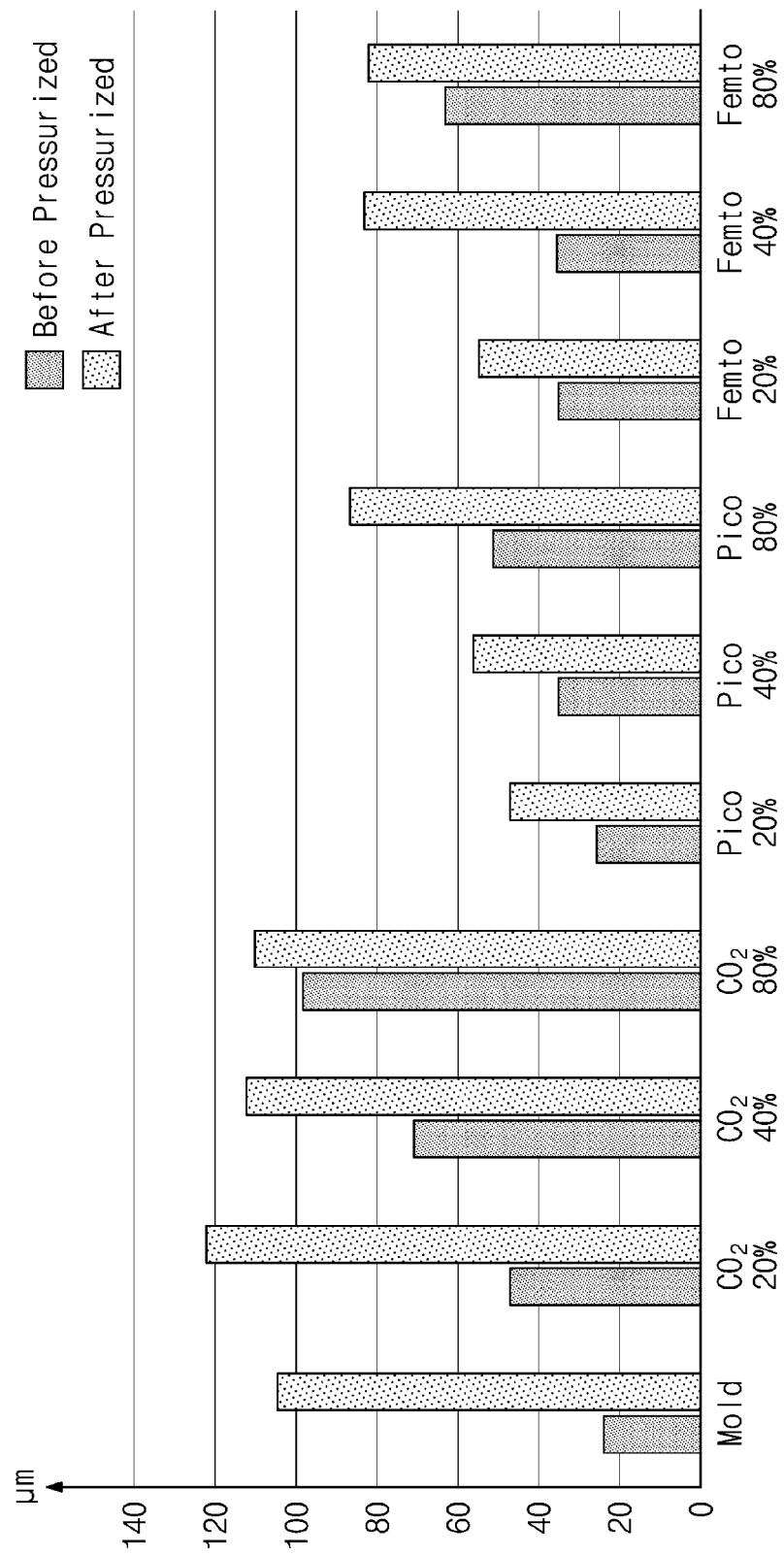
FIG. 17 is a graph schematically showing lengths of an overflow according to the type and power of a laser beam.

FIG. 16 is a schematic cross-sectional view of an adhesive sheet to which a window is bonded. FIG. 17 is a graph schematically showing lengths of an overflow according to the type and power of a laser beam.

Referring to FIG. 16 and FIG. 17, the adhesive layer AHL may be bonded to the window WIN to cover the bezel pattern BP.

In order to bond the adhesive layer AHL to which the refection prevention layer RPL and the display panel DP may be bonded, a lamination process may be performed. By the lamination process, the adhesive layer AHL becomes flat, and may cover the bezel pattern BP.

During the lamination process, the adhesive layer AHL may be pushed or swept by the window WIN due to an overflow. Due to an overflow of the adhesive layer AHL, an overflow plane OFP may be formed on the surface of the window WIN. The overflow plane OFP may be formed on a lower surface of the window WIN adjacent to both ends of the adhesive layer AHL.

As described above, a cutting surface of the adhesive layer AHL may have different physical properties depending on the type and power of a laser. The overflow plane OFP may be formed to have different lengths depending on the physical properties of a cutting surface.

The overflow plane OFP may become longer after being pressurized by the lamination process than before being pressurized. In case that the lengths of overflow planes OFP after being pressurized were compared, it was confirmed that the lengths of the overflow planes OFP of the adhesive layers AHL cut by a Pico laser beam or Femto laser beam were less than that of the adhesive layer AHL cut by a mold.

In the adhesive layer AHL cut by the Pico laser beam, the length of the overflow plane OFP may be about 87 μm in case that the power of the Pico laser beam is about 80%, and may be about 47 μm in case that the power of the Pico laser beam is about 20%. The power of the laser beam may be about 25 W in case about 100%.

In the adhesive layer AHL cut by the Femto laser beam, the length of the overflow plane OFP may be about 82 μm in case that the power of the Femto laser beam is about 80%, and may be about 55 μm in case that the power of the Femto laser beam is about 20%. In the case of the adhesive layer AHL cut by the same type of laser beam, the smaller the power of the laser beam, the smaller the length of the overflow plane OFP. For example, the adhesive layer AHL may be cut by a Pico laser beam or Femto laser beam having a power less than or equal to about 20% to reduce the length of the overflow plane OFP. Therefore, the length of the overflow plane OFP generated during the lamination process may be reduced to improve the quality of the window WIN.

The lamination process may be performed by a vacuum compression method. A contact surface of the window WIN bonded to the adhesive layer AHL may not be flat due to the bezel pattern BP disposed in the window WIN, and may have a step. During the lamination process, residual stress may remain in a step portion and generate air bubbles.

As described above, the side surface SSA of the adhesive layer AHL according to an embodiment of the disclosure may form an inclined surface in a direction perpendicular to the upper surface AUS and the lower surface ADS of the adhesive layer AHL. Therefore, during the lamination process, the adhesive layer AHL may more readily cover the step portion caused by the bezel pattern BP, thereby preventing the generation of air bubbles penetrating into the step portion. The adhesive layer AHL cut by a Pico laser beam or Femto laser beam, thereby having a cutting surface with improved quality, may prevent the penetration of air bubbles from the outside of the adhesive layer AHL during the lamination process.

The window WIN, the adhesive layer AHL, the refection prevention layer RPL, and the display panel DP may be bonded to manufacture the display device DD. In order to reduce a dead space of the display device DD, air bubbles penetrating into the display device DD should be prevented.

The display device DD manufactured using the adhesive sheet AHS according to an embodiment of the disclosure may prevent air bubbles which penetrate from the outside of the display device DD during a manufacturing process. Therefore, the dead space of the display device DD may be reduced.

Figure 18:
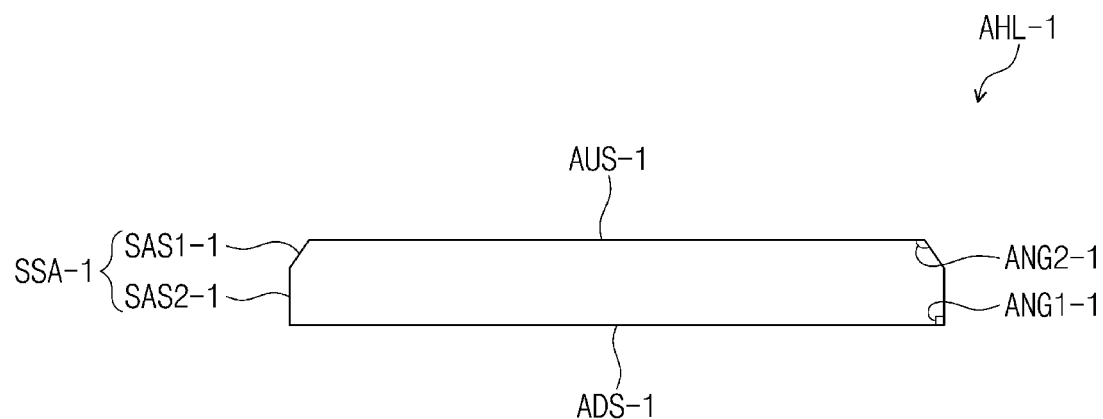
FIG. 18 is a schematic cross-sectional view of an adhesive layer according to an embodiment of the disclosure.

FIG. 18 is a schematic cross-sectional view of an adhesive layer according to an embodiment of the disclosure.

Referring to FIG. 18, an adhesive layer AHL-1 may include an upper surface AUS-1, a lower surface ADS-1 opposite to the upper surface AUS-1, and a side surface SSA-1 extending from the lower surface ADS-1 toward the upper surface AUS-1.

The side surface SSA-1 may include a first surface SAS1-1 extending from the upper surface AUS-1, and a second surface SAS2-1 extending from the first surface SAS1-1 to the lower surface ADS-1.

The first surface SAS1-1 and the second surface SAS2-1 may extend at different angles with respect to the upper surface AUS-1 and the lower surface ADS-1, respectively. When viewed in a direction parallel to the upper surface AUS-1 and the lower surface ADS-1, the first surface SAS1-1 and the second surface SAS2-1 may be disposed between the upper surface AUS-1 and the lower surface ADS-1. The first surface SAS1-1 may extend in a downward direction from the upper surface AUS-1, and the second surface SAS2-1 may extend in an upward direction from the lower surface ADS-1 to come into contact with each other. The second surface SAS2-1 may form a first angle ANG1-1 with the lower surface ADS-1, and the first surface SAS1-1 may form a second angle ANG2-1 with the upper surface AUS-1.

The first angle ANG1-1 may be a right angle, and the second angle ANG2-1 may be an obtuse angle. For example, the first surface SAS1-1 may form an obtuse angle with the upper surface AUS-1, and the second surface SAS2-1 may extend perpendicular to the lower surface ADS-1.

The side surface SSA-1 of the adhesive layer AHL-1 may be cut to a chamfer shape, and thus, may be more readily bonded to the window WIN, and may prevent air bubbles which penetrate into the inside of the adhesive layer AHL-1.

Figure 19:
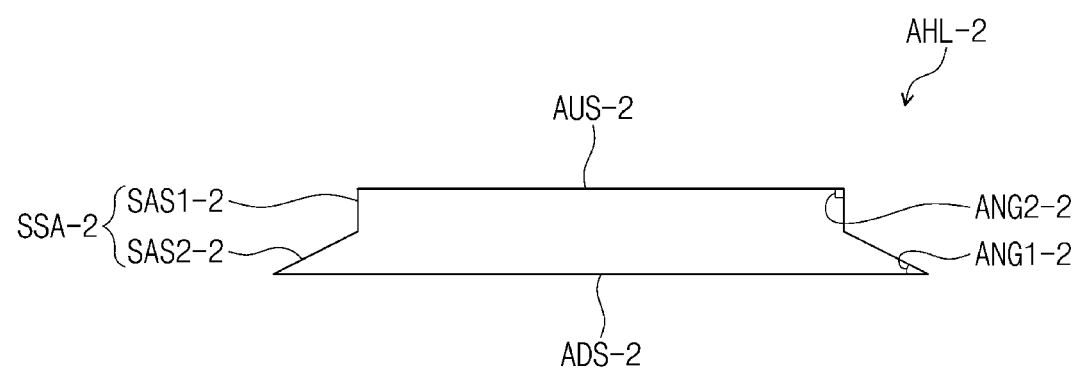
FIG. 19 is a schematic cross-sectional view of an adhesive layer according to an embodiment of the disclosure.

FIG. 19 is a schematic cross-sectional view of an adhesive layer according to an embodiment of the disclosure.

Referring to FIG. 19, an adhesive layer AHL-2 may include an upper surface AUS-2, a lower surface ADS-2 opposite to the upper surface AUS-2, and a side surface SSA-2 extending from the lower surface ADS-2 toward the upper surface AUS-2.

The side surface SSA-2 may include a first surface SAS1-2 extending from the upper surface AUS-2, and a second surface SAS2-2 extending from the first surface SAS1-2 to the lower surface ADS-2.

The second surface SAS2-2 may form a first angle ANG1-2 with the lower surface ADS-2, and the first surface SAS1-2 may form a second angle ANG2-2 with the upper surface AUS-2.

The first angle ANG1-2 may be an acute angle, and the second angle ANG2-2 may be a right angle. For example, the first surface SAS1-2 may extend perpendicular to the upper surface AUS-2, and the second surface SAS2-2 may form an acute angle with the lower surface ADS-2.

The side surface SSA-2 of the adhesive layer AHL-2 may be cut, and thus, may be more readily bonded to the window WIN, and may prevent air bubbles which penetrate into the inside of the adhesive layer AHL-2.

Figure 20:
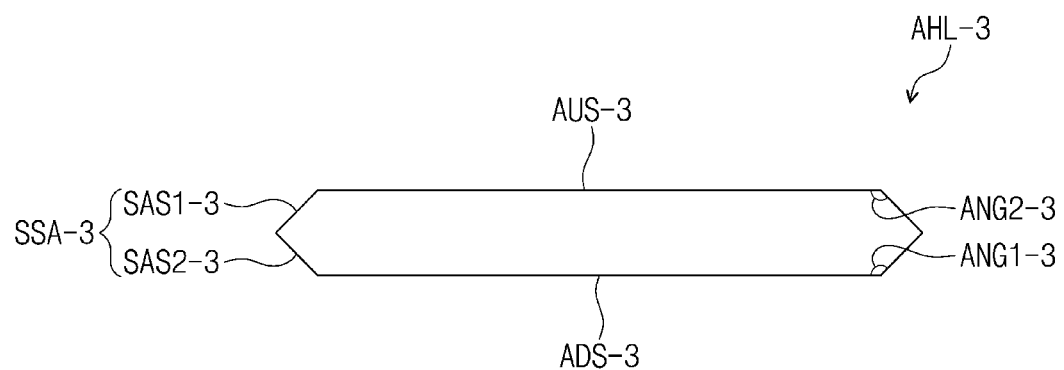
FIG. 20 is a schematic cross-sectional view of an adhesive layer according to an embodiment of the disclosure.

FIG. 20 is a schematic cross-sectional view of an adhesive layer according to an embodiment of the disclosure.

Referring to FIG. 20, an adhesive layer AHL-3 may include an upper surface AUS-3, a lower surface ADS-3 opposite to the upper surface AUS-3, and a side surface SSA-3 extending from the lower surface ADS-3 toward the upper surface AUS-3.

The side surface SSA-3 may include a first surface SAS1-3 extending from the upper surface AUS-3, and a second surface SAS2-3 extending from the first surface SAS1-3 to the lower surface ADS-3.

The second surface SAS2-3 may form a first angle ANG1-3 with the lower surface ADS-3, and the first surface SAS1-3 may form a second angle ANG2-3 with the upper surface AUS-3.

The first angle ANG1-3 may be an obtuse angle, and the second angle ANG2-3 may be an obtuse angle. For example, the first surface SAS1-3 may form an obtuse angle with the upper surface AUS-3, and the second surface SAS2-3 may form an obtuse angle with the lower surface ADS-3.

The side surface SSA-3 of the adhesive layer AHL-3 may be cut, and thus, may be more readily bonded to the window WIN, and may prevent air bubbles which penetrate into the inside of the adhesive layer AHL-3.

Figure 21:
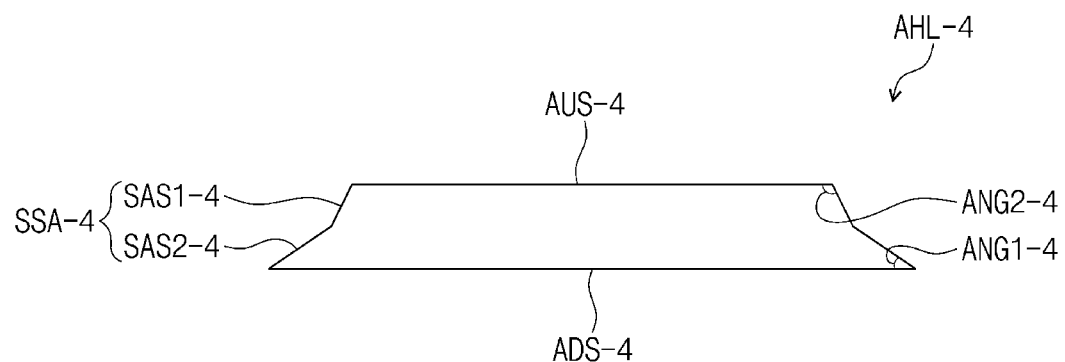
FIG. 21 is a schematic cross-sectional view of an adhesive layer according to an embodiment of the disclosure.

FIG. 21 is a schematic cross-sectional view of an adhesive layer according to an embodiment of the disclosure.

Referring to FIG. 21, an adhesive layer AHL-4 may include an upper surface AUS-4, a lower surface ADS-4 opposite to the upper surface AUS-4, and a side surface SSA-4 extending from the lower surface ADS-4 toward the upper surface AUS-4.

The side surface SSA-4 may include a first surface SAS1-4 extending from the upper surface AUS-4, and a second surface SAS2-4 extending from the first surface SAS1-4 to the lower surface ADS-4.

The second surface SAS2-4 may form a first angle ANG1-4 with the lower surface ADS-4, and the first surface SAS1-4 may form a second angle ANG2-4 with the upper surface AUS-4.

The first angle ANG1-4 may be an acute angle, and the second angle ANG2-4 may be an obtuse angle. For example, the first surface SAS1-4 may form an obtuse angle with the upper surface AUS-4, and the second surface SAS2-4 may form an acute angle with the lower surface ADS-4.

The side surface SSA-4 of the adhesive layer AHL-4 may be cut, and thus, may be more readily bonded to the window WIN, and may prevent air bubbles which penetrate into the inside of the adhesive layer AHL-4.

The display panel DP according to an embodiment of the disclosure may be a light emission type display panel, but is not particularly limited thereto. For example, the display panel DP may be an organic light emission display panel or a quantum dot light emitting display panel. A light emission layer of the organic light emission display panel may include an organic light emission material. A light emission layer of the quantum dot light emission display panel may include a quantum dot, a quantum rod, and the like. Herein, the display panel DP has been described as an organic light emission display panel.

According to an embodiment of the disclosure, the quality of a cutting surface of an adhesive sheet may be improved, and the overflow of the adhesive sheet occurring during a lamination process may be reduced, so that the quality of a window in contact with the adhesive sheet may be improved. It may be possible to prevent air bubbles which penetrate into a side surface of the adhesive sheet and a step between a window and a bezel pattern disposed in the window. Therefore, a dead space may be reduced by preventing the penetration of air bubbles into a bezel region.

Although the disclosure has been described with reference embodiments of the disclosure, it will be understood by those skilled in the art that various modifications and changes in form and details may be made therein without departing from the spirit and scope of the disclosure. The embodiments disclosed in the disclosure are not intended to limit the technical spirit of the disclosure, and all technical concepts falling within the scope of the following claims and equivalents thereof are to be construed as being included in the scope of the disclosure.

What is claimed is:

1. An adhesive sheet comprising:
   a first release film;
   a second release film disposed on the first release film; and
   an adhesive layer disposed between the first release film and the second release film, the adhesive layer including:
      an upper surface facing the second release film;
      a lower surface facing the first release film; and
      a side surface extending from an edge of the lower surface to an edge of the upper surface, wherein
   the side surface of the adhesive layer is inclined with respect to a direction perpendicular to the upper surface and the lower surface, the first release film, the adhesive layer, and the second release film are all completely cut through such that an incline surface is provided from a top of the second release film to a bottom of the first release film, the incline surface being incline with respect to a direction perpendicular to a lower surface of the first release film and a upper surface of the second release film, the incline surface is formed on outermost edges of the first release film, the second release film, and the adhesive layer, the adhesive layer comprises:
  a central portion; and
  an edge portion between the central portion and the side surface, a modulus of the edge portion is greater than a modulus of the central portion, a modulus of the side surface is greater than the modulus of the edge portion, an indentation creep of the edge portion is less than an indentation creep of the central portion, and an indentation creep of the side surface is less than the indentation creep of the edge portion.

2. The adhesive sheet of claim 1, wherein the side surface of the adhesive layer forms an acute angle with respect to the lower surface of the adhesive layer.

3. The adhesive sheet of claim 2, wherein the acute angle is an angle greater than or equal to about 30 degrees and less than 90 degrees.

4. The adhesive sheet of claim 1, wherein the side surface of the adhesive layer forms an obtuse angle with respect to the upper surface of the adhesive layer.

5. The adhesive sheet of claim 1, wherein in a direction horizontal to the upper surface and the lower surface, a length of the upper surface is less than a length of the lower surface.

6. The adhesive sheet of claim 1, wherein the side surface has a flat shape in an inclined direction.

7. The adhesive sheet of claim 1, wherein
a width of the edge portion, which is defined as a length between the central portion and the side surface, is less than about 2 mm.

8. The adhesive sheet of claim 1, wherein:
a thickness of the first release film and a thickness of the second release film are defined as lengths in the direction perpendicular to the upper surface and the lower surface; and
the thickness of the first release film is less than the thickness of the second release film.

9. The adhesive sheet of claim 1, wherein
the side surface comprises:
  a first surface extending from the upper surface; and
  a second surface extending from the first surface to the lower surface, and
the first surface and the second surface extend at different angles with respect to the upper surface and the lower surface.

10. The adhesive sheet of claim 9, wherein:
the first surface forms an obtuse angle with respect to the upper surface; and
the second surface extends perpendicular to the lower surface.

11. The adhesive sheet of claim 9, wherein:
the first surface extends perpendicular to the upper surface; and
the second surface forms an acute angle with respect to the lower surface.

12. The adhesive sheet of claim 9, wherein:
the first surface forms an obtuse angle with respect to the upper surface; and
the second surface forms an obtuse angle with respect to the lower surface.

13. The adhesive sheet of claim 9, wherein:
the first surface forms an obtuse angle with respect to the upper surface; and
the second surface forms an acute angle with respect to the lower surface.

14. The adhesive sheet of claim 1, wherein
the adhesive layer further comprises a second side surface extending from a second edge of the lower surface to a second edge of the upper surface,
both the first and second side surfaces of the adhesive layer are inclined with respect to a direction perpendicular to a lower surface of the first release film and a upper surface of the second release film.

15. The adhesive sheet of claim 14, wherein
the first release film, the adhesive layer, and the second release film are all completely cut through such that the first release film, the adhesive layer, and the second release film together form a trapezoidal shape.

* * * * *